(12) United States Patent
Wang et al.

(10) Patent No.: US 10,615,804 B2
(45) Date of Patent: Apr. 7, 2020

(54) CLOCK AND DATA RECOVERY CIRCUIT

(71) Applicant: MEDIATEK INC., Hsin-Chu (TW)

(72) Inventors: Chien-Chung Wang, Hsinchu Hsien (TW); Meng-Tse Weng, Hsinchu Hsien (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/139,415

(22) Filed: Sep. 24, 2018

(65) Prior Publication Data

US 2019/0280696 A1 Sep. 12, 2019

(30) Foreign Application Priority Data

Mar. 7, 2018 (TW) .............................. 107107725 A

(51) Int. Cl.
*H03L 7/08* (2006.01)
*H03L 7/089* (2006.01)

(52) U.S. Cl.
CPC .......... *H03L 7/0807* (2013.01); *H03L 7/0891* (2013.01)

(58) Field of Classification Search
CPC ........ H03L 7/00; H03L 7/0807; H03L 7/0891
USPC ................ 327/141, 144, 146, 155, 165, 166
See application file for complete search history.

(56) References Cited

U.S. PATENT DOCUMENTS

| | | | | |
|---|---|---|---|---|
| 6,211,741 B1* | 4/2001 | Dalmia | ................ | H03D 13/004 327/147 |
| 6,259,755 B1* | 7/2001 | O'Sullivan | ............. | H03L 7/087 375/376 |
| 8,671,305 B1* | 3/2014 | Shih | ...................... | H03L 7/0807 713/400 |
| 2006/0215296 A1* | 9/2006 | Latchman | ............... | H04L 7/033 360/51 |

FOREIGN PATENT DOCUMENTS

| | | |
|---|---|---|
| TW | 201012066 A | 3/2010 |
| TW | 201515470 A | 4/2015 |

* cited by examiner

*Primary Examiner* — William Hernandez
(74) *Attorney, Agent, or Firm* — Winston Hsu

(57) ABSTRACT

A clock and data recovery circuit includes a first phase detector, a first charge pump, a first voltage-controlled oscillator (VCO), and an auxiliary module. The auxiliary module includes: an auxiliary clock generator, generating an auxiliary clock signal; a second phase detector, coupled to the auxiliary clock generator, comparing a phase of the auxiliary clock signal with that of a first clock signal outputted by the first VCO; and a multiplexing selecting unit, outputting a multiplexing output signal to the first charge pump according to a selection signal.

18 Claims, 9 Drawing Sheets

CLOCK AND DATA RECOVERY CIRCUIT

This application claims the benefit of Taiwan application Serial No. 107107725, filed Mar. 7, 2018, the subject matter of which is incorporated herein by reference.

BACKGROUND OF THE INVENTION

Field of the Invention

The invention relates to a clock and data recovery circuit, and more particularly to a clock and data recovery circuit capable of preventing loss of lock.

Description of the Related Art

With the rapid development of process technologies, the operation speed of integrated circuits has significantly increased. In a communication system of high-speed transmission, a clock and data recovery (CDR) circuit is frequently used to ensure that input data transmitted can be corrected read. A clock and data recovery circuit needs to perform sampling at the time of a rising edge or a falling edge (i.e., the time at which a data signal transits from 0 to 1 or 1 to 0, also referred to as a transient time) of a data signal transmitted from a transmitter end, so as to perform correct phase and frequency tracking operations. Further, the phase/frequency tracking capability of a clock and data recovery circuit relies on the stable and continual transitions of the state of a data signal.

However, for applications of certain communication systems, a transmitter end may transmit a data signal which is in a value 0 for a long period or is in a value 1 for a long period. In the above situation, there may be a long period in which the transition in the state of data signal does not occur and the frequency of a clock signal outputted by the clock and data recovery circuit may then gradually lose lock.

SUMMARY OF THE INVENTION

It is a primary object of the present invention to provide a data and clock recovery (CDR) circuit capable of preventing loss of lock so as to overcome the issue of the prior art.

A clock and data recovery circuit disclosed by the present invention includes: a first phase detector, comparing the phase of a data signal with that of a first clock signal to output a first output signal, which indicates whether the phase of the data signal is ahead or behind that of the first clock signal; an auxiliary module, including an auxiliary clock generator that generates an auxiliary clock signal, a second phase detector that is coupled to the auxiliary clock signal and compares the phase of the auxiliary clock signal with that of the first clock signal to output a second output signal, which indicates whether the phase of the auxiliary clock signal is ahead or behind that of the first clock signal, and a multiplexing selecting unit that is coupled between the first phase detector and the second phase detector and outputs a multiplexing output signal according to a selection signal; a first charge pump, coupled to the multiplexing selecting unit, outputting a control signal according to the multiplexing output signal; and a voltage-controlled oscillator (VCO), coupled to the first charge pump, generating the first clock signal according to the control signal.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
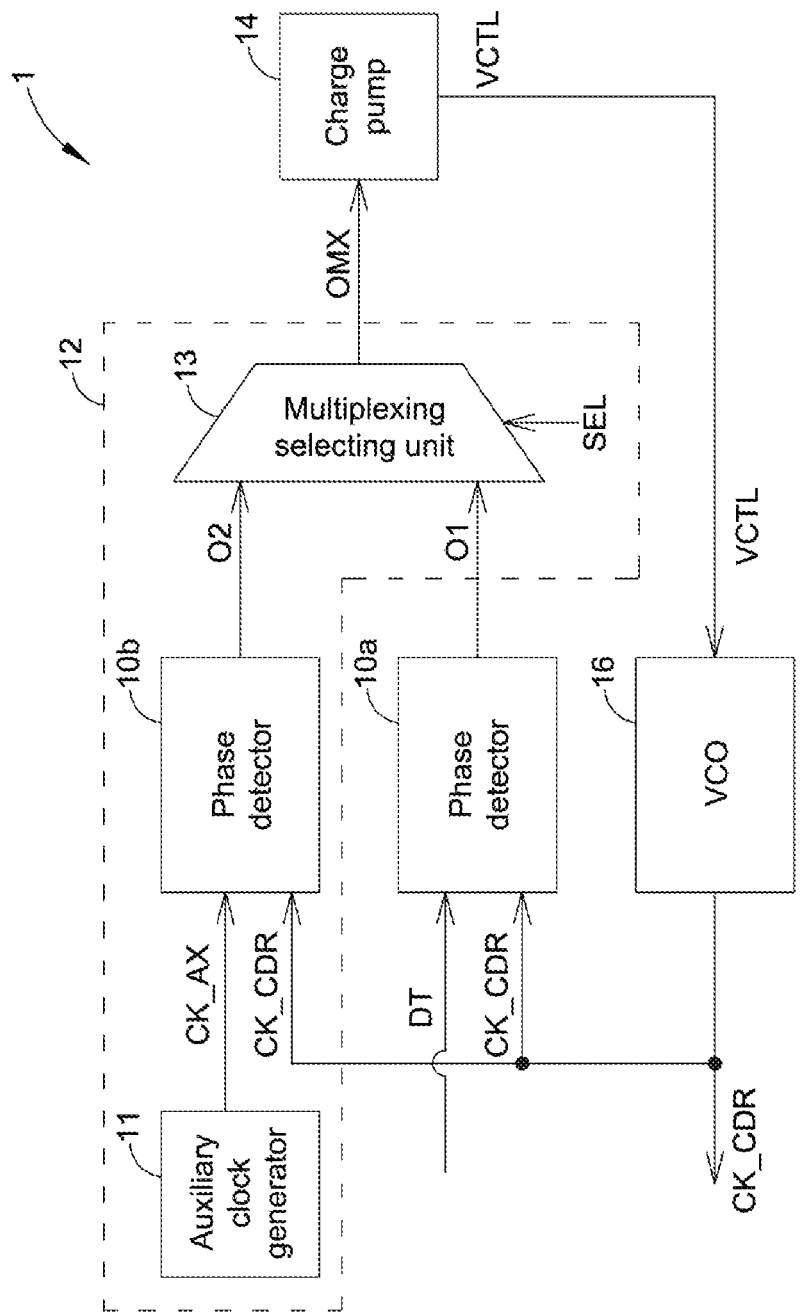
FIG. 1 is a block diagram of a clock and data recovery (CDR) circuit according to an embodiment of the present invention.

FIG. 1 shows a block diagram of a clock and data recovery (CDR) circuit 1 according to an embodiment of the present invention. The clock and data recovery circuit 1 includes a phase detector 10a, an auxiliary module 12, a charge pump (CP) 14 and a voltage-controlled oscillator (VCO) 16. The phase detector 10a receives a data signal DT and a first clock signal CK_CDR, and compares the phases of the data signal DT and the first clock signal CK_CDR to output a first output signal O1. The charge pump 14, coupled to the phase detector 10a, outputs a control signal VCTL. The VCO 16, coupled to the charge pump 14, generates the first clock signal CK_CDR according to the control signal VCTL. When the charge pump 14 receives the first output signal O1 and the first output signal O1 indicates that the phase of the first clock signal CK_CDR is behind the phase of the data signal DT, the charge pump 14 increases the voltage or amplitude of the first clock signal CK_CDR outputted therefrom, such that the frequency of the first clock signal CK_CDR generated by the VCO 16 accordingly increases. When the charge pump 14 receives the first output signal O1 and the first output signal O1 indicates that the phase of the first clock signal CK_CDR is ahead the phase of the data signal DT, the charge pump 14 decreases the voltage or amplitude of the first clock signal CK_CDR outputted therefrom, such that the frequency of the first clock signal CK_CDR generated by the VCO 16 accordingly decreases.

Thus, the clock and data recovery circuit 1 can lock the frequency of the first clock signal CK_CDR, and the frequency of the first clock signal CK_CDR can then be associated with the symbol rate or bit rate of the data signal DT, wherein the symbol rate (bit rate) is the reciprocal of an interval of one symbol (bit) of the data signal DT. For example, the frequency of the first clock signal CK_CDR is an integral multiple (e.g., twice) of the symbol rate (or the bit rate) of the data signal DT.

When the data signal DT is 0 for a long period (i.e., the data clock DT stays 0 in multiple consecutive clock cycles) or is 1 for a long period (i.e., the data clock DT stays 1 in multiple consecutive clock cycles), the clock and data recovery circuit may lose lock. That is to say, when the data signal DT is 0 for a long period or is 1 for a long period, the clock and data recovery circuit 1 may not be able to lock the frequency of the first clock signal CK_CDR and to have the frequency of the first clock signal CK_CDR be associated with the bit rate/symbol rate of the data signal, i.e., the frequency of the first clock signal CK_CDR may gradually lose the association with the symbol rate/bit rate of the data signal DT. To prevent loss of lock caused by the data signal DT remaining in a value 0 for a long period or in a value 1 for a long period, the auxiliary module 12 included in the clock and data recovery circuit 1 is coupled between the phase detector 10a and the charge pump 14. The auxiliary module 12 is for providing an appropriate auxiliary clock signal when the data signal DT is in a value 0 for a long period or is in a value 1 for a long period, so as to assist and prevent the clock and data recovery circuit 1 from loss of lock.

More specifically, the auxiliary module 12 includes an auxiliary clock generator 11, a phase detector 10b and a multiplexing selecting unit 13. The auxiliary clock generator 11 generates an auxiliary clock signal CK_AX. The phase detector 10b is coupled to the auxiliary clock generator 11 and the VCO 16 to receive the auxiliary clock signal CK_AX and the first clock signal CK_CDR. The phase detector 10b, similar to the phase detector 10a, compares the phases of the auxiliary clock signal CK_AX and the first clock signal CK_CDR to output a second output signal O2. The second output signal O2 may indicate that the phase of the auxiliary clock signal CK_AX is ahead of the phase of the first clock signal CK_CDR, or may indicate that the phase of the auxiliary clock signal CK_AX is behind the phase of the first clock signal CK_CDR. When the charge pump 14 receives the second output signal O2 and the second output signal O2 indicates that the phase of the first clock signal CK_CDR is behind the phase of the auxiliary clock signal CK_AX, the charge pump 14 increases the voltage or amplitude of the control signal VCTL outputted therefrom, such that the frequency of the first clock signal CK_CDR generated by the VCO 16 accordingly increases. When the charge pump 14 receives the second output signal O2 and the second output signal O2 indicates that the phase of the first clock signal CK_CDR is ahead the phase of the auxiliary clock signal CK_AX, the charge pump 14 decreases the voltage or amplitude of the control signal VCTL outputted therefrom, such that the frequency of the first clock signal CK_CDR generated by the VCO 16 accordingly decreases.

The multiplexing selecting unit 13, coupled to the phase detectors 10a and 10b and an external control circuit (not shown), receives a selection signal SEL from the external control signal to selectively output the first output signal O1 or the second output signal O2 as a multiplexing output signal OMX. When the external control circuit learns in advance that the data signal DT is to remain in a value 0 for a long period or in a value 1 for a long period, the external control circuit may generate the selection signal SEL to control the multiplexing selecting unit 13 to output the second output signal O2 as the multiplexing output signal OMX to the charge pump 14. At this point, the charge pump 14 outputs the control signal VCTL according to the second output signal O2, and the VCO 16 generates the first clock signal CK_CDR according to the control signal VCTL associated with the second output signal O2. Conversely, when the state of the data signal DT transits in a stable and continual manner, the output signal OMX is the first output signal O1 and is sent to the charge pump 14.

Figure 2:
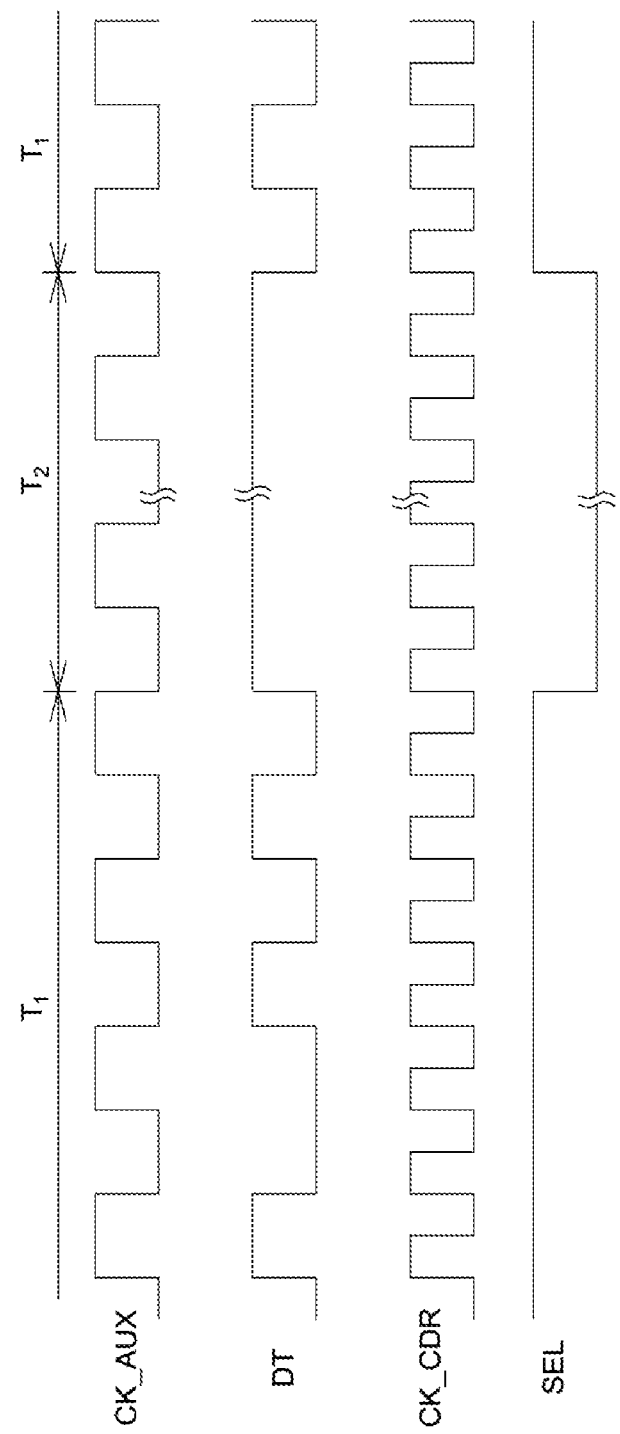
FIG. 2 is a waveform diagram of multiple signals according to an embodiment of the present invention.

FIG. 2 shows a waveform diagram of the data signal DT, the auxiliary clock signal CK_AX, the first clock signal CK_CDR and the selection signal SEL according to an embodiment of the present invention. In normal conditions (corresponding to a time interval $T_1$), the clock and data recovery circuit 1 considers the data signal DT as a target for frequency locking, the selection signal SEL generated by the external control circuit controls the multiplexing selecting unit 13 in the time interval $T_1$ to output the first output signal O1 as the multiplexing output signal OMX to the charge pump 14, i.e., locking the frequency of the first clock signal CK_CDR to have the same to be associated with the data signal DT. When the external control circuit determines in advance that the data signal DT is to remain in a value 0 for a long period or in a value 1 for a long period (e.g., a time interval $T_2$), the clock and data recovery circuit 1 considers the auxiliary clock signal CK_AX as a target for frequency locking, and the selection signal SEL generated by the external control circuit controls the multiplexing selecting unit 13 in the time interval $T_2$ to output the second output signal O2 as the multiplexing output signal OMX to the charge pump 14, i.e., locking the frequency of the first clock signal CK_CDR to have the same to be associated with the auxiliary clock signal CK_AX, such that the first clock signal CK_CDR does not lose lock in the time interval $T_2$.

The phase detectors 10a and 10b are not limited to specific circuit structures. For example, the phase detectors 10a and 10b may be implemented by Hogge phase detectors. Details of Hogge phase detectors are generally known to a person skilled in the art, and are omitted herein.

Figure 3:
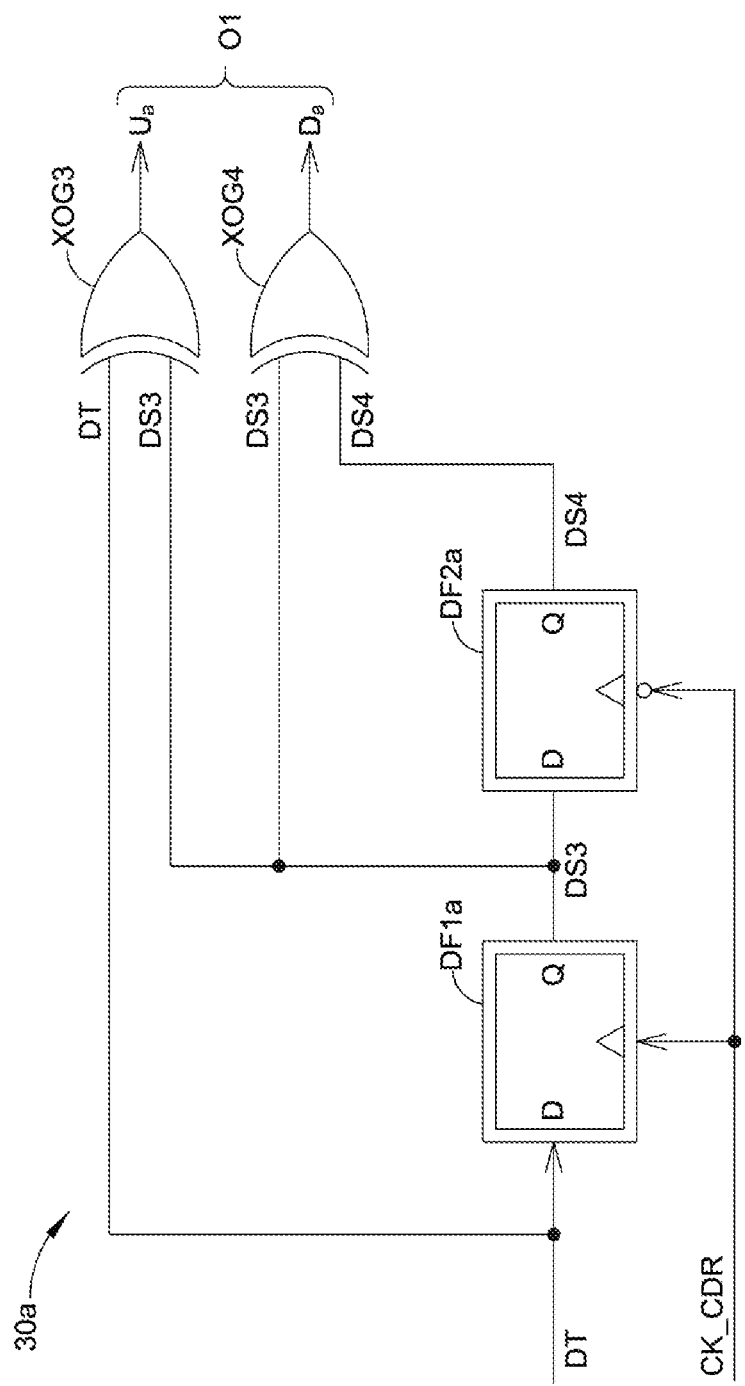
FIG. 3 is a block diagram of a phase detector according to an embodiment of the present invention.
Figure 4:
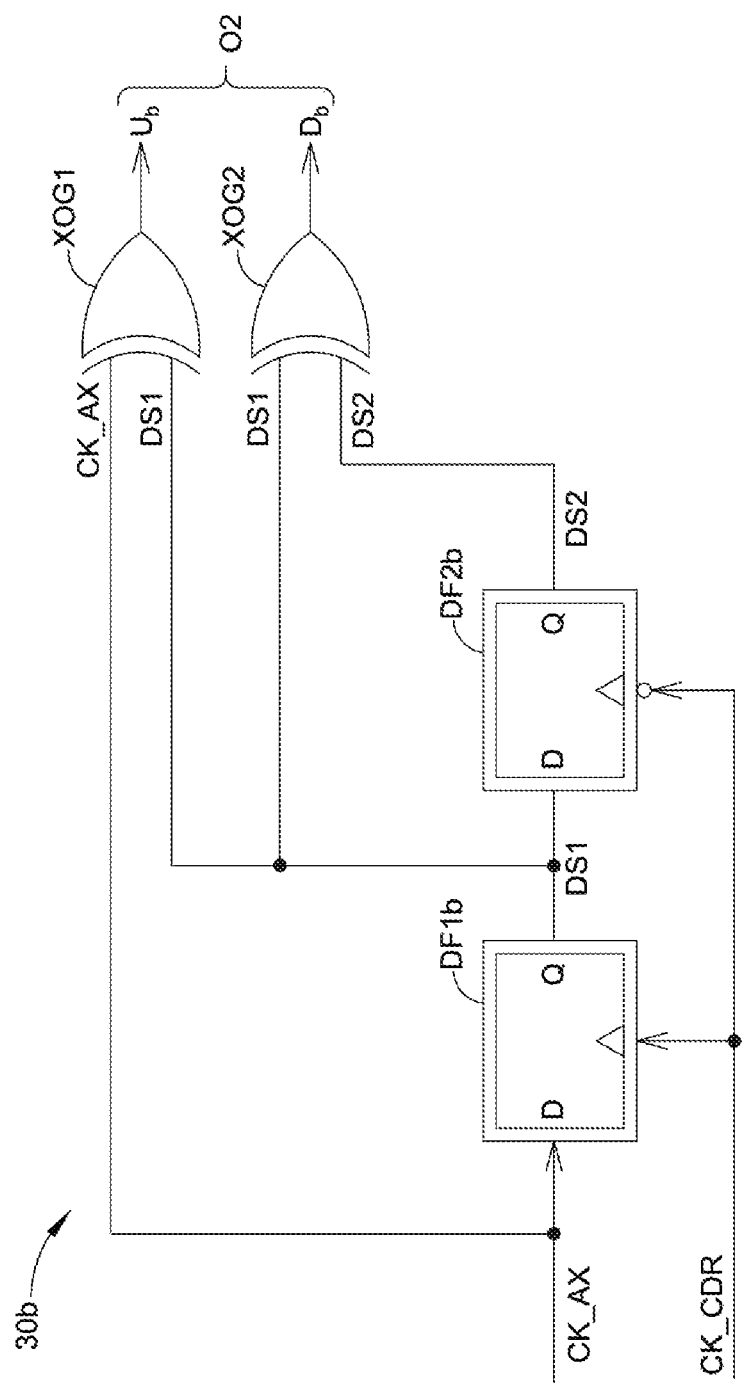
FIG. 4 is a block diagram of a phase detector according to an embodiment of the present invention.

FIG. 3 and FIG. 4 are block diagrams of a phase detector 30a and a phase detector 30b according to an embodiment of the present invention, respectively. The phase detectors 30a and 30b are respectively for implementing the phase detectors 10a and 10b. The phase detector 30a includes delay units DF1a and DF2a, and exclusive OR (XOR) gates XOG3 and XOG4. The phase detector 30b includes delay units DF1b and DF2b, and XOR gates XOG1 and XOG2. The delay units DF1a, DF2a, DF1b and DF2b may be D flip-flops. The delay unit DF1a receives the data signal DT and the first clock signal CK_CDR to generate a delayed signal DS3. The delay unit DF2a receives the delay signal DS3 and the first clock signal CK_CDR to generate a delayed signal DS4. The delay unit DF1b receives the auxiliary clock signal CK_AX and the first clock signal CK_CDR to generate a delayed signal DS1. The delay unit DF2b receives the delayed signal DS1 and the first clock signal CK_CDR to generate a delayed signal DS2. The XOR gate XOG1 performs an XOR operation on the auxiliary clock signal CK_AX and the delay signal DS1 to generate a rising signal $U_b$. The XOR gate XOG2 performs an XOR operation on the delayed signal DS1 and the delayed signal DS2 to generate a falling signal $D_b$. The XOR gate XOG3 performs an XOR operation on the data signal DT and the delayed signal DS3 to generate a rising signal $U_a$. The XOR gate XOG4 performs an XOR operation on the delayed signal DS3 and the delayed signal DS4 to generate a falling signal $D_a$. The rising signal $U_a$ and the falling signal $D_a$ form the first output signal O1, and the rising signal $U_b$ and the falling signal $D_b$ form the second output signal O2; that is, the first output signal O1 consists of the rising signal $U_a$ and the falling signal $D_a$, and the second output signal O2 consists of the rising signal $U_b$ and the falling signal $D_b$.

Figure 5:
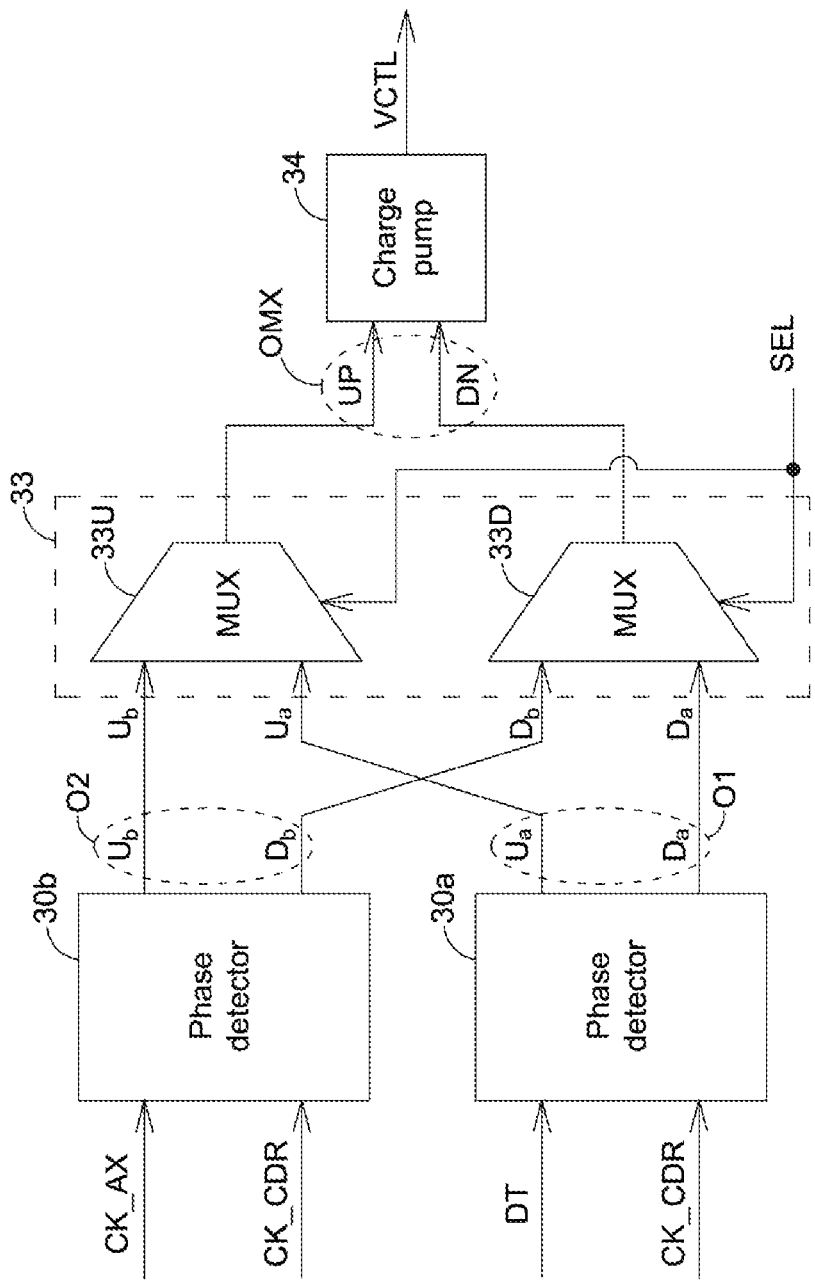
FIG. 5 is a block diagram of a multiplexing selecting unit according to an embodiment of the present invention.

Further, in response to the rising signal $U_a$ and the falling signal $D_a$ (the first output signal O1) generated by the phase detector 30a, and the rising signal $U_b$ and the falling signal $D_b$ (the second output signal O2) generated by the phase detector 30b, the multiplexing selecting unit 13 may include two multiplexers. FIG. 5 shows a block diagram of the phase detectors 30a and 30b, a multiplexing selecting unit 33 and a charge pump 34. The multiplexing selecting unit 33a and the charge pump 34 may be used to respectively implement the multiplexing selecting unit 13 and the charge pump 14. As shown in FIG. 5, the multiplexing selecting unit 33 includes multiplexers (MUX) 33U and 33D. The multiplexer 33U receives the rising signal $U_a$ and the rising signal $U_b$, and outputs a rising signal UP according to the selection signal SEL. The multiplexer 33D receives the falling signal $D_a$ and the falling signal $D_b$, and outputs a falling signal DN according to the selection signal SEL. The rising signal UP and the falling signal DN form the multiplexing output signal OMX, i.e., the multiplexing output signal OMX consists of the rising signal UP and the falling signal DN.

Figure 6:
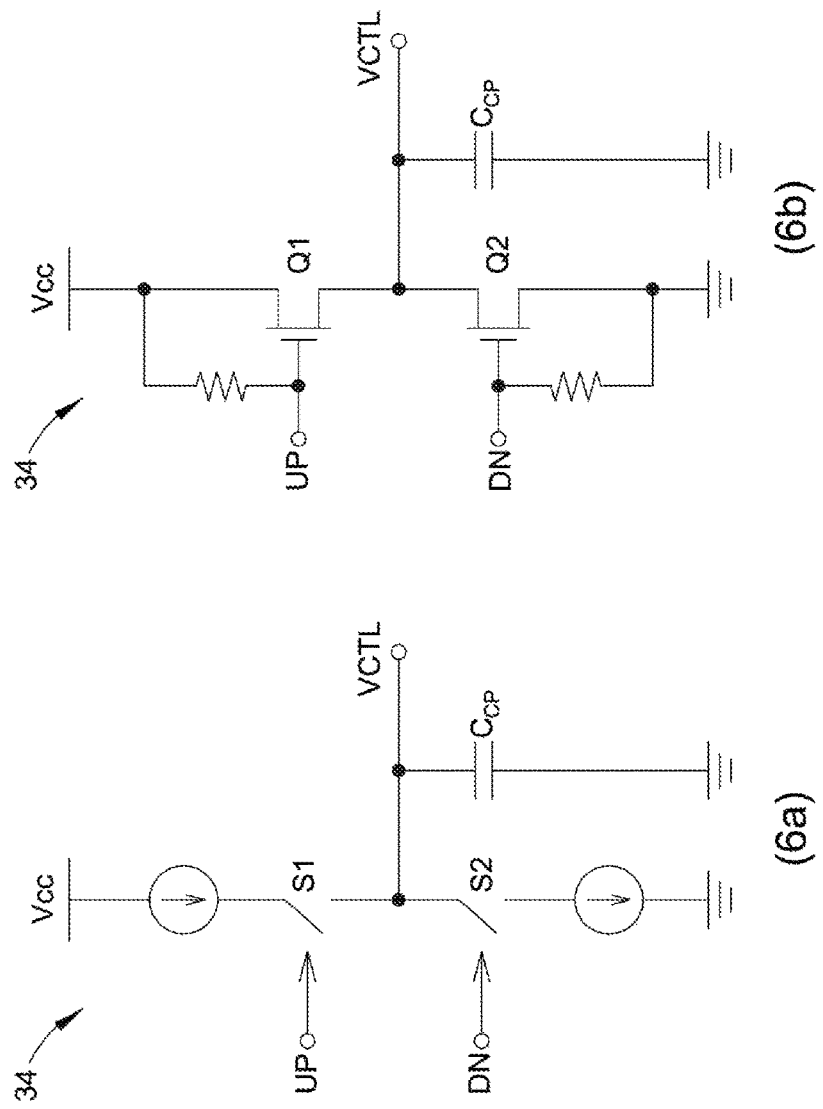
FIG. 6 is a circuit diagram of a charge pump according to an embodiment of the present invention.

FIG. 6 shows a circuit diagram of the charge pump 34. Referring to FIG. 6, a sub diagram 6a is a circuit schematic diagram of the charge pump 34, and a sub diagram 6b is a specific circuit diagram of the charge pump 34. In the sub diagram 6a, the charge pump 34 includes switches S1 and S2 and a capacitor $C_{CP}$. One end of the switch S1 receives a positive voltage Vcc and the other end is coupled to the capacitor $C_{CP}$. One end of the switch S2 is grounded (i.e., receiving a ground voltage), and the other end is coupled to the capacitor $C_{CP}$. The capacitor $C_{CP}$ is for outputting the control signal VCTL. The switch S1 is controlled by the rising signal UP, and the switch S2 is controlled by the falling signal DN. Further, as shown by the sub diagram 6b, the switches S1 and S2 may be respectively implemented by transistors Q1 and Q2. Other associated details are generally known to a person skilled in the art, and are omitted herein.

Figure 7:
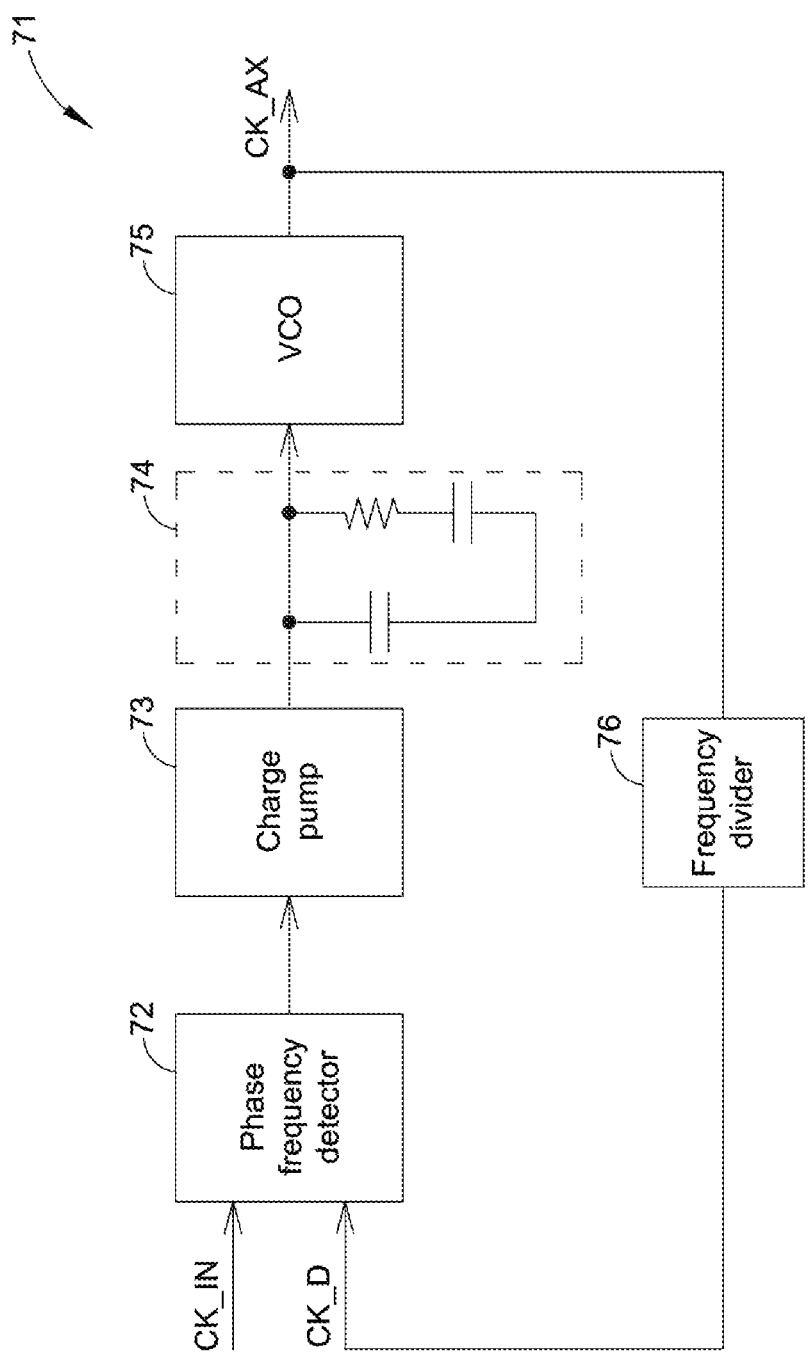
FIG. 7 is a circuit diagram of an auxiliary clock generator according to an embodiment of the present invention.

The auxiliary clock generator 11 is not limited to a specific circuit structure, and may be a free-run oscillator (FRO) or an oscillator similar to a phase-locked loop (PLL). FIG. 7 shows a circuit diagram of an auxiliary clock generator 71 according to an embodiment of the present invention. As shown in FIG. 7, the auxiliary clock generator 71 includes a phase frequency detector (PFD) 72, a charge pump 73, a low-pass filter (LPF) 74, a VCO 75 and a frequency divider 76. The VCO 75 outputs the auxiliary clock signal CK_AX. The frequency divider 76 can generate a frequency dividing signal CK_D according to the auxiliary clock signal CK_AX. The phase frequency detector 72 receives an input clock signal CK_IN, and compares the phases and frequencies of the input clock signal CK_IN and the frequency dividing signal CK_D to generate an output signal to the charge pump 73. Other associated details are generally known to a person skilled in the art, and are omitted herein.

Figure 8:
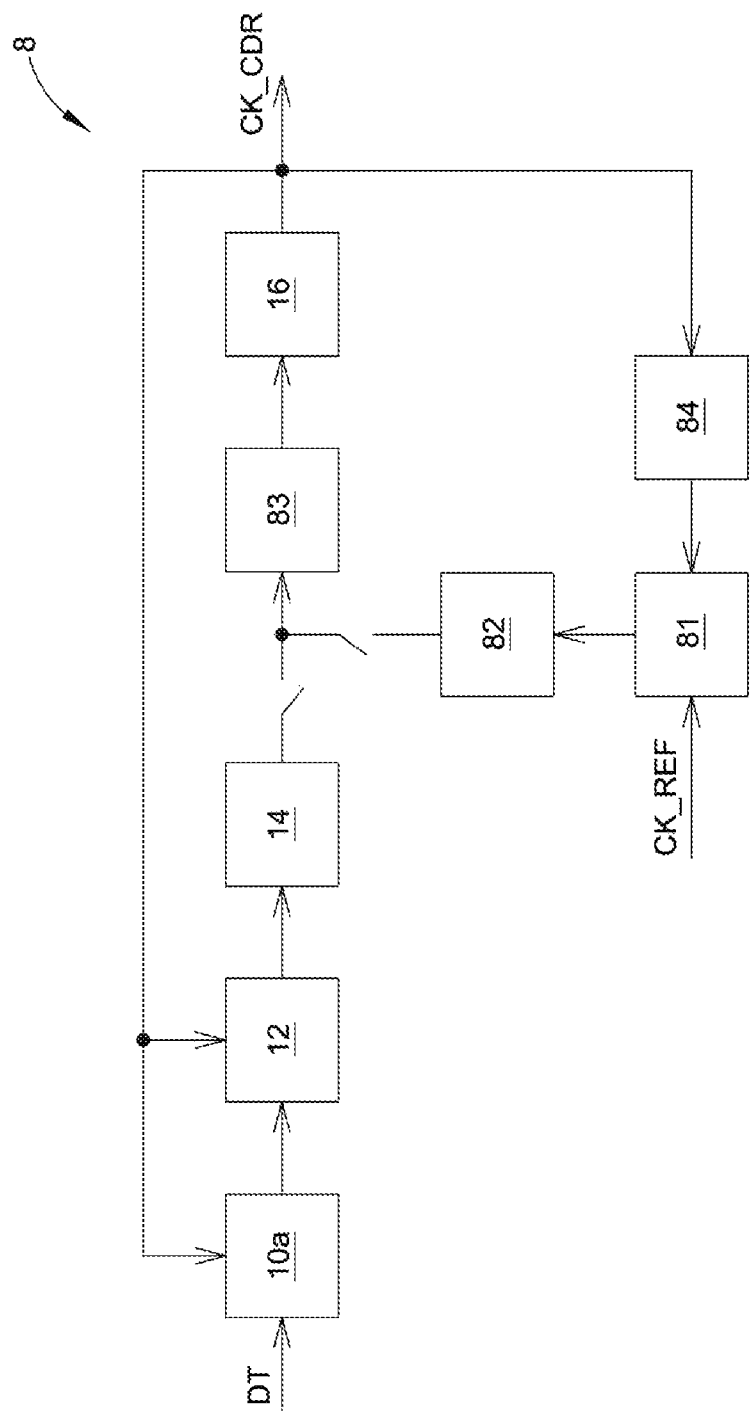
FIG. 8 is a block diagram of a clock and data recovery circuit according to an embodiment of the present invention.
Figure 9:
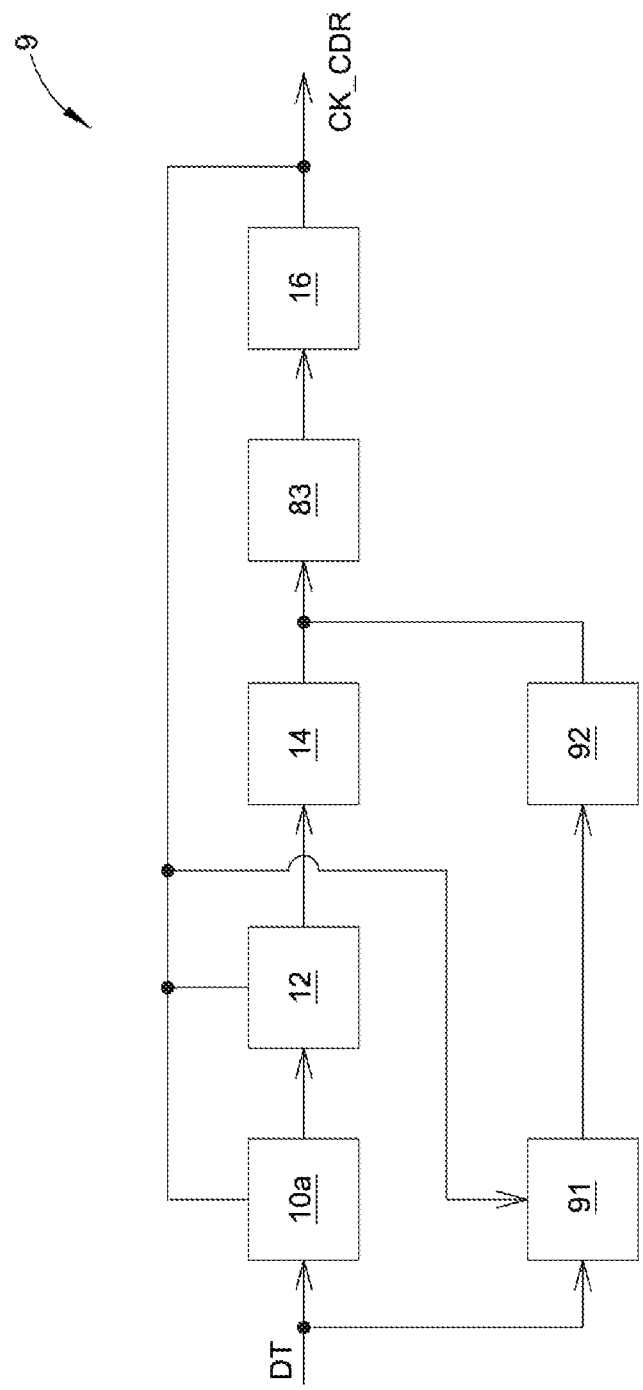
FIG. 9 is a block diagram of a clock and data recovery circuit according to an embodiment of the present invention.

It should be noted that, the foregoing embodiments are for illustrating the concept of the present invention, and a person skilled in the art can accordingly make various modifications that are not limited to the above embodiments. For example, the auxiliary module 12 is applicable in a clock and data recovery circuit operable to receive an external reference clock signal or a data and clock recovery circuit capable of frequency detection. FIG. 8 and FIG. 9 are block diagrams of a clock and data recovery circuit 8 and a clock and data recovery circuit 9 according to other embodiments of the present invention. Referring to FIG. 8, the data and clock recovery circuit 8 is similar to the clock and data recovery circuit 1, and the same elements are represented by the same denotations. Different from the clock and data recovery circuit 1, the clock and data recovery circuit 8 further includes a PFD 81, a charge pump 82, an LPF 83 and a frequency divider 84. Connections of the above elements are drawn in FIG. 8. The phase frequency detector 81 is coupled to the VCO 16, and receives an external reference clock signal CK_REF. The clock and data recovery circuit 8 can use the phase frequency detector 81 to lock the frequency and phase of the external reference clock signal CK_REF. Referring to FIG. 9, the clock and data recovery circuit 9 is similar to the clock and data recovery circuit 1 or 8, and the same elements are represented by the same denotations. Different from the clock and data recovery circuit 1 or 8, the clock and data recovery circuit 9 further includes a frequency detector (FD) 91 and a charge pump 92. The connections of the elements are shown in FIG. 9. The frequency detector 91 is coupled to the VCO 16. The clock and data recovery circuit 9 can use the frequency detector 91 to first lock the frequency of the data signal DS, and then use the phase detector 10a to lock the phase of the data signal DT. Details of the clock and data recovery circuit operable to receive the external reference clock signal, details of a clock and data recovery circuit capable of frequency detection, and details of the (phase) frequency detector are generally known to a person skilled in the art, and are omitted herein.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A clock and data recovery circuit, comprising:
    a first phase detector, comparing a phase of a data signal with that of a first clock signal to output a first output signal, wherein the first output signal indicates whether the phase of the data signal is ahead or behind that of the first clock signal;
    an auxiliary module, comprising:
        an auxiliary clock generator, generating an auxiliary clock signal;
        a second phase detector, coupled to the auxiliary clock generator, comparing a phase of the auxiliary clock signal with that of the first clock signal to output a second output signal, wherein the second output signal indicates whether the phase of the auxiliary clock signal is ahead or behind that of the first clock signal; and
        a multiplexing selecting unit, coupled to the first phase detector and the second phase detector, outputting a multiplexing output signal according to a selection signal;
    a first charge pump, coupled to the multiplexing selecting unit, outputting a control signal according to the multiplexing output signal; and
    a first voltage-controlled oscillator (VCO), coupled to the first charge pump, generating the first clock signal according to the control signal;
    wherein the second phase detector comprises:
    a first delay unit, receiving the auxiliary clock signal and the first clock signal to generate a first delayed signal;
    a second delay unit, coupled to the first delay unit, receiving the first delayed signal and the first clock signal to generate a second delayed signal;

a first exclusive OR (XOR) gate, performing an XOR operation on the auxiliary clock signal and the first delayed signal to generate a first rising signal; and
a second XOR gate, performing an XOR operation on the first delayed signal and the second delayed signal to generate a first falling signal;
wherein, the first rising signal and the first falling signal form the second output signal.

2. The clock and data recovery circuit according to claim 1, wherein the first phase detector comprises:
a third delay unit, receiving the data signal and the first clock signal to generate a third delayed signal;
a forth delay unit, coupled to the third delay unit, receiving the third delayed signal and the first clock signal to generate a fourth delayed signal;
a third XOR gate, performing an XOR operation on the data signal and the third delayed signal to generate a second rising signal; and
a fourth XOR gate, performing an XOR operation on the third delayed signal and the fourth delayed signal to generate a second falling signal;
wherein the second rising signal and the second falling signal form the first output signal.

3. The clock and data recovery circuit according to claim 2, wherein the multiplexing selecting unit comprises:
a first multiplexer, receiving the first rising signal and the second rising signal, and outputting a third rising signal according to the selection signal; and
a second multiplexer, receiving the first falling signal and the second falling signal, and outputting a third falling signal according to the selection signal;
wherein, the third rising signal and the third falling signal form the multiplexing output signal.

4. The clock and data recovery circuit according to claim 3, wherein the first charge pump comprises:
a capacitor, outputting the control signal;
a first switch, having one end thereof receiving a first voltage and one other end thereof coupled to the capacitor, the first switch controlled by the third rising signal; and
a second switch, having one end thereof receiving a second voltage and one other end thereof coupled to the capacitor, the second switch controlled by the third falling signal.

5. The clock and data recovery circuit according to claim 4, wherein the first switch is a first transistor, the second switch is a second transistor, the first voltage is a positive voltage, and the second voltage is a ground voltage.

6. The clock and data recovery circuit according to claim 1, wherein the multiplexing selecting unit is coupled to a control circuit, which generates the selection signal.

7. The clock and data recovery circuit according to claim 1, further comprising another phase frequency detector, which is coupled to the first VCO and receives a reference clock signal.

8. The clock and data recovery circuit according to claim 1, further comprising a phase detector, which is coupled to the first VCO.

9. A clock and data recovery circuit, comprising:
a first phase detector, comparing a phase of a data signal with that of a first clock signal to output a first output signal, wherein the first output signal indicates whether the phase of the data signal is ahead or behind that of the first clock signal;
an auxiliary module, comprising:
an auxiliary clock generator, generating an auxiliary clock signal;
a second phase detector, coupled to the auxiliary clock generator, comparing a phase of the auxiliary clock signal with that of the first clock signal to output a second output signal, wherein the second output signal indicates whether the phase of the auxiliary clock signal is ahead or behind that of the first clock signal; and
a multiplexing selecting unit, coupled to the first phase detector and the second phase detector, outputting a multiplexing output signal according to a selection signal;
a first charge pump, coupled to the multiplexing selecting unit, outputting a control signal according to the multiplexing output signal; and
a first voltage-controlled oscillator (VCO), coupled to the first charge pump, generating the first clock signal according to the control signal;
wherein the auxiliary clock generator comprises:
a phase frequency detector, receiving an input clock signal;
a second charge pump, coupled to the phase frequency detector; and
a second VCO, coupled between the second charge pump and the phase frequency detector, generating the auxiliary clock signal.

10. The clock and data recovery circuit according to claim 9, wherein the auxiliary clock generator further comprises:
a frequency divider, coupled between the second VCO and the phase frequency detector, generating a frequency dividing signal according to the auxiliary clock signal; and
wherein, the phase frequency detector receives the frequency dividing signal.

11. The clock and data recovery circuit according to claim 9, wherein the auxiliary clock generator further comprises:
a low-pass filter (LPF), coupled between the second charge pump and the second VCO.

12. A clock and data recovery circuit, comprising:
a first phase detector, comparing a phase of a data signal with that of a first clock signal to output a first output signal;
an auxiliary module, comprising:
an auxiliary clock generator, generating an auxiliary clock signal;
a second phase detector, coupled to the auxiliary clock generator, comparing a phase of the auxiliary clock signal with that of the first clock signal to output a second output signal; and
a multiplexing selecting unit, coupled to the first phase detector and the second phase detector, outputting a multiplexing output signal according to a selection signal;
a charge pump, coupled to the multiplexing selecting unit, outputting a control signal according to the multiplexing output signal; and
a voltage-controlled oscillator (VCO), coupled to the charge pump, generating the first clock signal according to the control signal;
wherein the selection signal indicates a characteristic of the data signal, and the multiplexing selecting unit refers to the selection signal to select one of the first output signal and the second output signal to generate the multiplexing output signal.

13. The clock and data recovery circuit according to claim 12, wherein the selection signal indicates if the data signal stays in a same logic value in multiple consecutive clock cycles.

14. The clock and data recovery circuit according to claim 13, wherein the selection signal indicates if the data signal stays in the same logic value in the multiple consecutive clock cycles that make the clock and data recovery circuit gradually lose lock.

15. The clock and data recovery circuit according to claim 13, wherein if the selection signal indicates that the data signal stays in the same logic value in the multiple consecutive clock cycles, the multiplexing selecting unit selects the second output signal serving as the multiplexing output signal;

and if the selection signal indicates that the data signal does not stay in the same logic value in the multiple consecutive clock cycles, the multiplexing selecting unit selects the first output signal serving as the multiplexing output signal.

16. The clock and data recovery circuit according to claim 12, wherein when the selection signal indicates that the data signal has a first characteristic, the multiplexing selecting unit selects the first output signal serving as the multiplexing output signal; and when the selection signal indicates that the data signal has a second characteristic, the multiplexing selecting unit selects the second output signal serving as the multiplexing output signal.

17. The clock and data recovery circuit according to claim 16, wherein when the selection signal is switched from indicating the first characteristic to the second characteristic of the data signal, the multiplexing selecting unit switches from outputting the first output signal to the second output signal to make that the VCO continuously generates the first clock signal.

18. The clock and data recovery circuit according to claim 12, wherein in a normal condition, the multiplexing selecting unit refers to the selection signal having a first state to select the first output signal to generate the multiplexing output signal; and once the selection signal changes from the first state to a second state, the multiplexing selecting unit selects the second output signal to generate the multiplexing output signal.

* * * * *